(12) United States Patent
Shiobara et al.

(10) Patent No.: US 7,687,227 B2
(45) Date of Patent: Mar. 30, 2010

(54) RESIST PATTERN FORMING METHOD AND MANUFACTURING METHOD OF SEMICONDUCTOR DEVICE

(75) Inventors: Eishi Shiobara, Yokohama (JP); Daisuke Kawamura, Yokohama (JP); Yasunobu Onishi, Yokohama (JP); Shinichi Ito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 527 days.

(21) Appl. No.: 11/316,898

(22) Filed: Dec. 27, 2005

(65) Prior Publication Data

US 2007/0042297 A1    Feb. 22, 2007

(30) Foreign Application Priority Data

Dec. 27, 2004    (JP)    ............................ 2004-378298

(51) Int. Cl.
G03F 7/26    (2006.01)
(52) U.S. Cl. ...................................................... 430/311
(58) Field of Classification Search ................. 430/322, 430/311
See application file for complete search history.

(56) References Cited

U.S. PATENT DOCUMENTS

| 6,372,413 | B2 | 4/2002 | Ema et al. | |
|---|---|---|---|---|
| 6,742,944 | B2 | 6/2004 | Takahashi et al. | |
| 2001/0034131 | A1* | 10/2001 | Sato et al. | 438/700 |
| 2003/0045121 | A1* | 3/2003 | Higashi | 438/758 |
| 2004/0029026 | A1 | 2/2004 | Hayasaki et al. | |
| 2004/0075895 | A1 | 4/2004 | Lin | |
| 2004/0224512 | A1* | 11/2004 | Sato et al. | 438/689 |
| 2004/0253547 | A1 | 12/2004 | Endo et al. | |
| 2004/0259008 | A1* | 12/2004 | Endo et al. | 430/31 |
| 2005/0042554 | A1* | 2/2005 | Dierichs et al. | 430/322 |
| 2005/0069819 | A1* | 3/2005 | Shiobara | 430/327 |
| 2005/0173682 | A1* | 8/2005 | Zhang et al. | 252/582 |
| 2005/0175776 | A1* | 8/2005 | Streefkerk et al. | 427/256 |

(Continued)

FOREIGN PATENT DOCUMENTS

JP    08-316121    * 11/1996

(Continued)

OTHER PUBLICATIONS

English translation of JP 08-316121, Nov. 1996.*

(Continued)

*Primary Examiner*—Kathleen Duda
*Assistant Examiner*—Brittany Raymond
(74) *Attorney, Agent, or Firm*—Finnegan, Henderson, Farabow, Garrett & Dunner, L.L.P.

(57) ABSTRACT

According to an aspect of the invention, there is provided a resist pattern forming method of forming a resist pattern by immersion exposure, comprising forming a resist film on a substrate to be treated, a contact angle between the resist film and an immersion liquid being a first angle, forming a first cover film on the resist film, a contact angle between the first cover film and the immersion liquid being a second angle which is larger than the first angle, forming a second cover film on the first cover film, a contact angle between the second cover film and the immersion liquid being a third angle which is smaller than the second angle, and forming a latent image on the resist film by the immersion exposure.

17 Claims, 6 Drawing Sheets

U.S. PATENT DOCUMENTS

2005/0248741 A1    11/2005    Kawamura et al.

FOREIGN PATENT DOCUMENTS

| JP | 10-303114 | 11/1998 |
|---|---|---|
| TW | 222670 | 10/2004 |
| TW | 1222670 | 10/2004 |
| WO | WO 2004/112108 A1 | 12/2004 |

OTHER PUBLICATIONS

K. Ishizuka et al., "New Cover Material Development Status for Immersion Lithography," International Symposium on Immersion and 157nm Lithography (Aug. 4, 2004).

S. Owa et al., "Immersion lithography; its potential performance and issues," Proceedings of SPIE (2003), 5040:724-733.

Notification for Filing Opinion mailed by the Korean Patent Office on Nov. 24, 2006, in counterpart Korean Patent Application 10- 2005-129528.

Kaplan et al., "Characterization of refractive properties of fluids for immersion photolithography," International Symposium on Immersion and 157 nm Lithography (Aug. 3, 2004).

Kawamura, D. et al., "Device Manufacturing Method," U.S. Appl. No. 11/175,275, filed Jul. 7, 2005.

Written Decision of Granted Patent Right issued May 6, 2007, in counterpart Taiwanese Patent Application No. 094143749 and English language translation thereof.

* cited by examiner

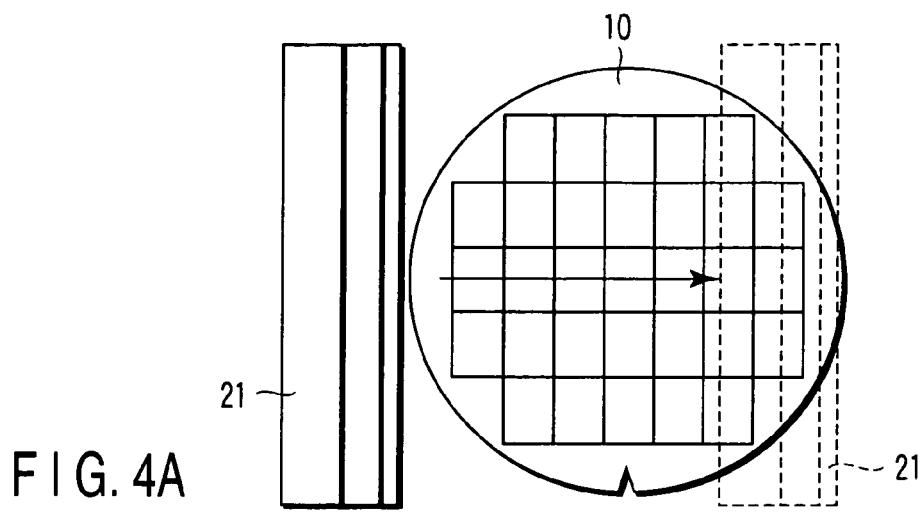
FIG. 4A
FIG. 4B
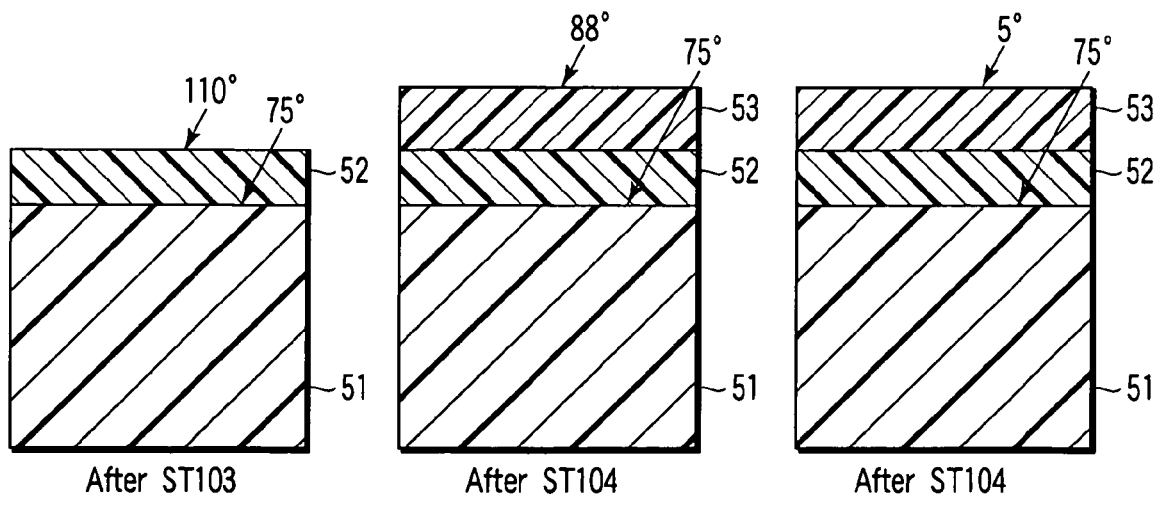
FIG. 5A  After ST103
FIG. 5B  After ST104
FIG. 5C  After ST104

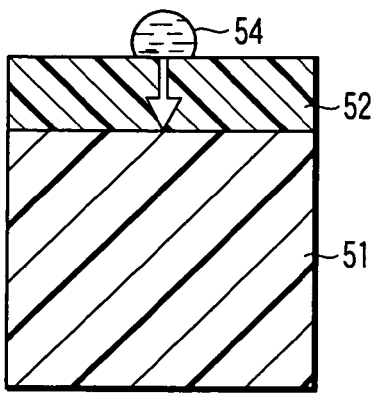
F I G. 10A
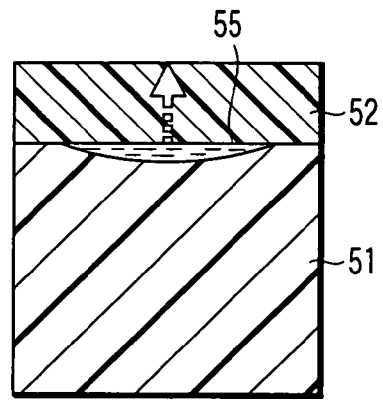
F I G. 10B
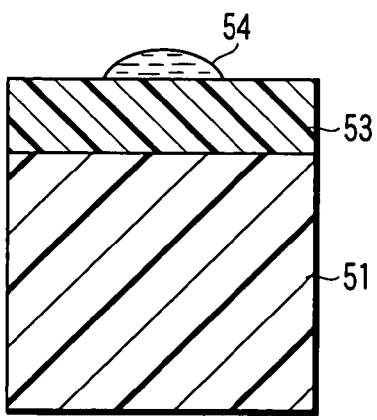
F I G. 11A
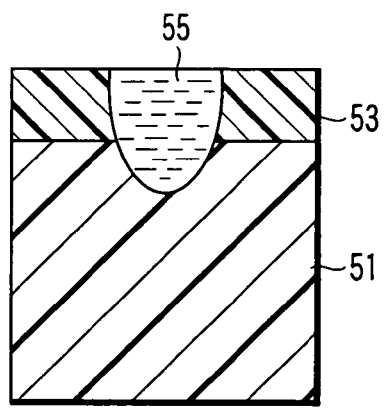
F I G. 11B
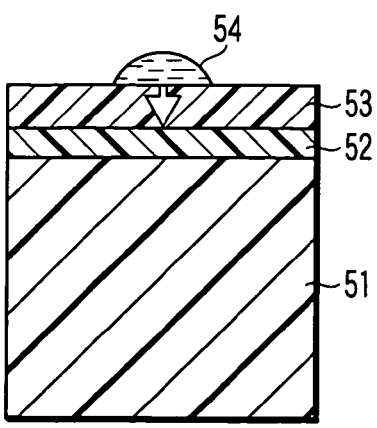
F I G. 12A
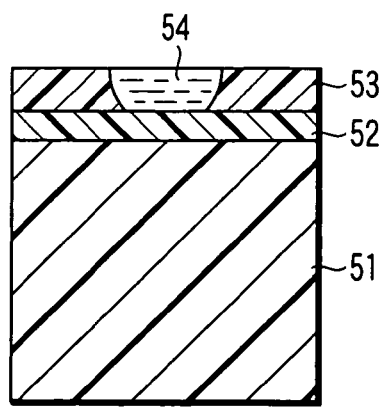
F I G. 12B

RESIST PATTERN FORMING METHOD AND MANUFACTURING METHOD OF SEMICONDUCTOR DEVICE

CROSS-REFERENCE TO RELATED APPLICATIONS

This application is based upon and claims the benefit of priority from prior Japanese Patent Application No. 2004-378298, filed Dec. 27, 2004, the entire contents of which are incorporated herein by reference.

BACKGROUND OF THE INVENTION

1. Field of the Invention

The present invention relates to a resist pattern forming method by immersion exposure of a lithography step in a semiconductor manufacturing process, and a manufacturing method of a semiconductor device.

2. Description of the Related Art

Immersion exposure is a technology in which a space between the surface of a resist film and a lens of an exposure device is filled with a liquid to perform exposure on the resist film formed on a substrate to be treated. A device for use in such an exposure process is disclosed in, for example, Jpn. Pat. Appln. KOKAI Publication No. 10-303114. In Jpn. Pat. Appln. KOKAI Publication No. 10-303114, there is disclosed a device in which a substrate to be treated is all immerged into water in a stage to which water can be supplied, and the exposure is performed while this stage is relatively moved with respect to the exposure device. In the device having such configuration, the liquid is supplied to the whole stage. Therefore, there is a problem that the liquid overflows from the stage, when the stage is moved at a high speed. The stage cannot be driven at a high speed.

In Immersion Lithography; its Potential Performance and Issues, Proc. of SPIE Vol. 5040, pp. 724 to 733 by Soichi Owa and Hiroyuki Nagasaka, as a measure against disturbance of the liquid due to the movement of the stage, there is disclosed a technology to drive the stage while locally supplying the liquid to a portion to be exposed. According to this technology, it is possible to move the stage at a high speed. When such technology to supply the liquid locally is used, water is left in an exposed region and the like of a portion from which the lens is detached. In consequence, when the resist film is exposed and thereafter heated in this state, there is a problem that a watermark is generated, or an abnormality is generated in a resist pattern owing to a temperature drop in the portion where water exists.

On the other hand, in New Cover Material Development Status for Immersion Lithography, Web Publication of International Symposium on Immersion and 157 nm Lithography by Keita Ishizuka et al., it is disclosed that components of a resist are eluted from the resist film into the liquid in the immersion exposure. According to this document, such elution can be avoided by disposing a cover film on the surface of the resist film. As to a state of the surface of the cover film, it is preferable that a contact angle of the surface to water is 90° or more. However, in a case where the cover film having such a large contact angle is used, there might occur a problem that the watermark is easily generated on the cover film, and a defect due to the watermark is generated in the resist pattern. In this document, there is also disclosed an example in which a film having a contact angle of 68° or 78° to an immersion liquid (pure water) is used as a hydrophilic cover film.

BRIEF SUMMARY OF THE INVENTION

According to an aspect of the invention, there is provided a resist pattern forming method of forming a resist pattern by immersion exposure, comprising: forming a resist film on a substrate to be treated, a contact angle between the resist film and an immersion liquid being a first angle; forming a first cover film on the resist film, a contact angle between the first cover film and the immersion liquid being a second angle which is larger than the first angle; forming a second cover film on the first cover film, a contact angle between the second cover film and the immersion liquid being a third angle which is smaller than the second angle; and forming a latent image on the resist film by the immersion exposure.

According to another aspect of the invention, there is provided a manufacturing method of a semiconductor device by use of a semiconductor substrate having a resist pattern formed by: forming a resist film on a substrate to be treated, a contact angle between the resist film and an immersion liquid being a first angle; forming a first cover film on the resist film, a contact angle between the first cover film and the immersion liquid being a second angle which is larger than the first angle; forming a second cover film on the first cover film, a contact angle between the second cover film and the immersion liquid being a third angle which is smaller than the second angle; and forming a latent image on the resist film by immersion exposure.

BRIEF DESCRIPTION OF THE SEVERAL VIEWS OF THE DRAWING

FIGS. 4A and 4B are diagrams showing that a cleaning liquid is removed in the embodiment;

FIGS. 5A, 5B, and 5C are sectional views showing a part of the steps of manufacturing the semiconductor device in the embodiment;

FIGS. 10A and 10B are diagrams showing the cover film on a resist film in a conventional example;

FIGS. 11A and 11B are diagrams showing the cover film on the resist film in the conventional example; and FIGS. 12A and 12B are diagrams showing the cover film on the resist film in the embodiment.

DETAILED DESCRIPTION OF THE INVENTION

An embodiment of the present invention will be described hereinafter with reference to the drawings.

Figure 1:
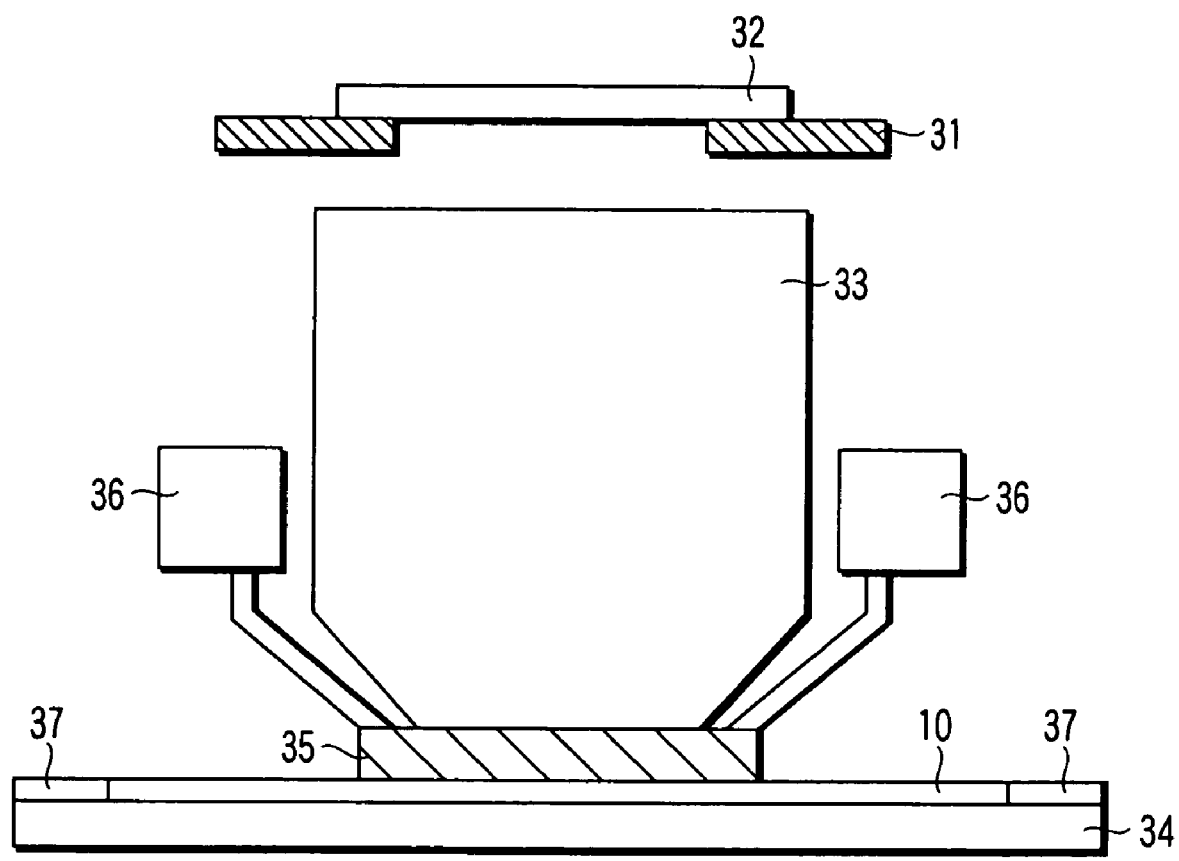
FIG. 1 is a diagram showing a schematic configuration of an exposure tool in an embodiment.

FIG. 1 is a diagram showing a schematic configuration of an exposure tool in the embodiment. The exposure tool shown in FIG. 1 is of an immersion type. A reticle stage 31 is disposed below an optical illumination system (not shown), and a reticle 32 is disposed on the reticle stage 31. The reticle stage 31 is movable in parallel. A projection lens system 33 is disposed below the reticle stage 31. A wafer stage 34 is disposed below the projection lens system 33. A semiconductor substrate (semiconductor wafer, substrate to be treated) 10 subjected to a treatment described later is laid on the wafer stage 34. The wafer stage 34 moves in parallel together with the semiconductor substrate 10. A support plate 37 is disposed in a periphery of the semiconductor substrate 10.

A fence 35 is attached below the projection lens system 33. Beside the projection lens system 33, a pair of water supply and discharge units 36, 36 are disposed which supply ultra pure water (immersion liquid) into the fence 35 and discharge the ultra pure water from the fence 35. During exposure, a space between the semiconductor substrate 10 and the projection lens system 33 is filled with a liquid film of the ultra pure water in a region surrounded with the fence 35 and the projection lens system 33. Exposure light emitted from the projection lens system 33 passes through a layer of the ultra pure water, and reaches a region to be irradiated. An image of a mask pattern (not shown) on the reticle 32 is projected onto a photo resist (not shown) on the semiconductor substrate 10 surface corresponding to the region to be irradiated, and a latent image is formed.

Figure 2:
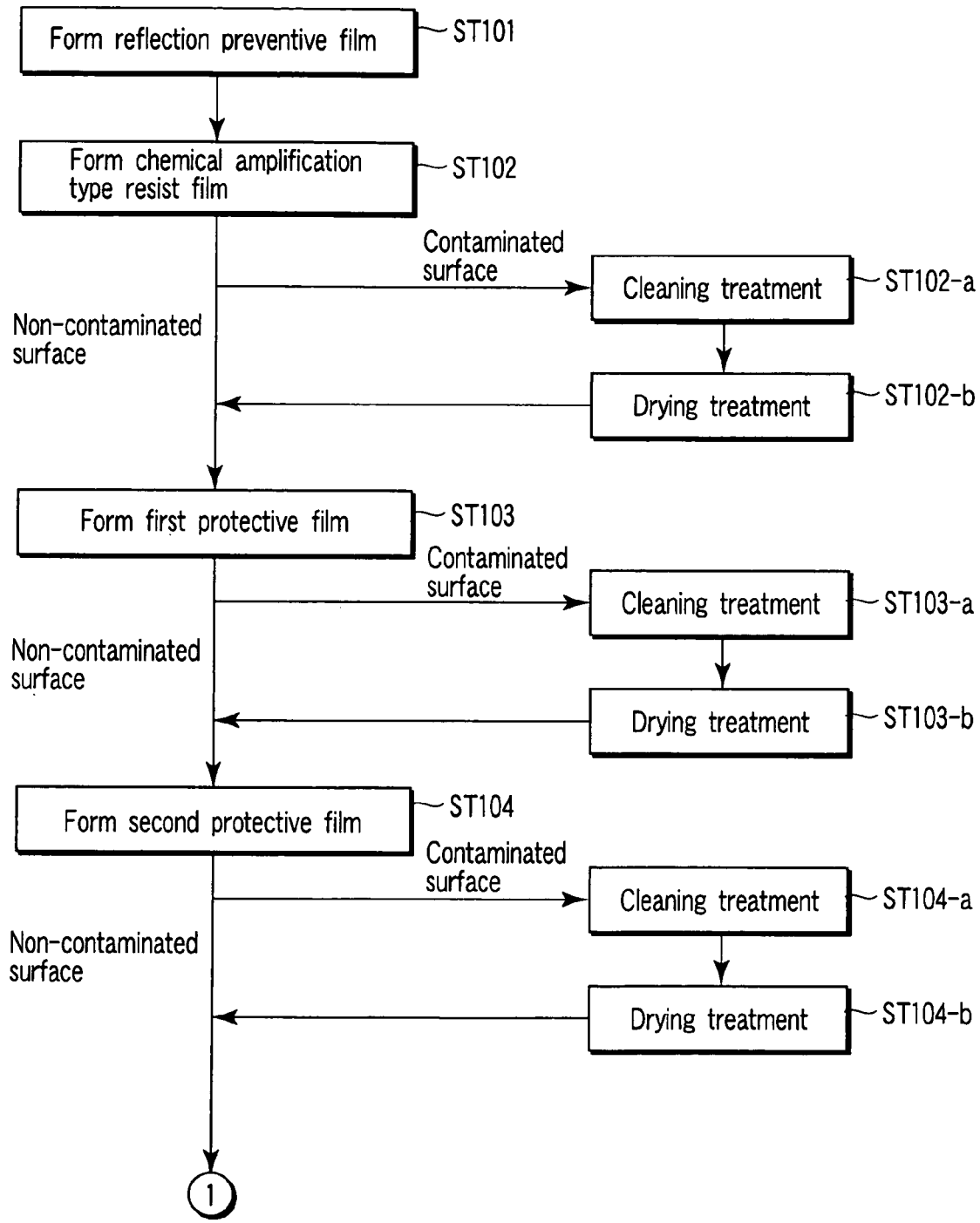
FIG. 2 is a flowchart showing steps of manufacturing a semiconductor device in the embodiment.
Figure 3:
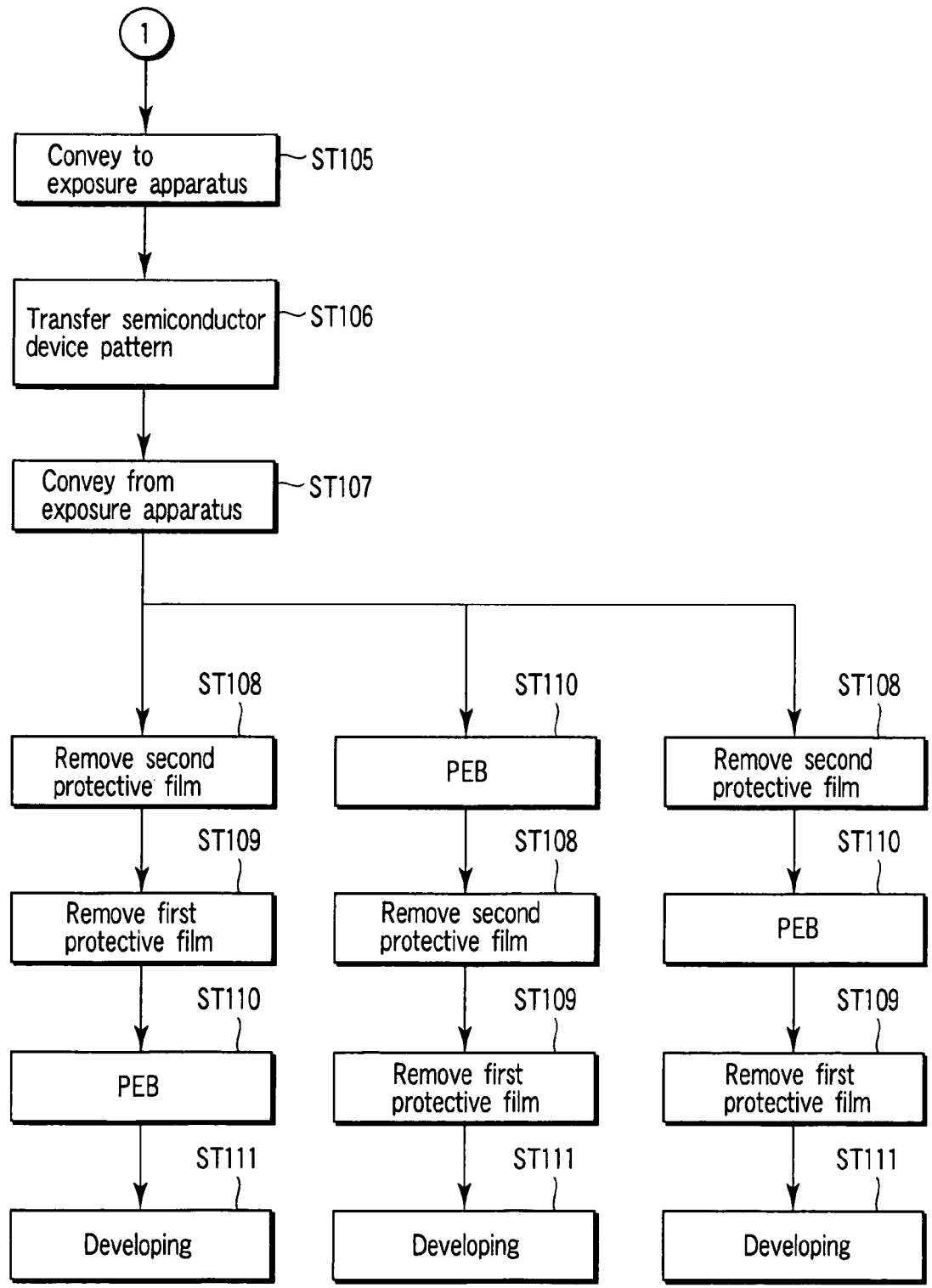
FIG. 3 is a flowchart showing steps of manufacturing the semiconductor device in the embodiment.

FIGS. 2 and 3 are flowcharts showing steps of manufacturing a semiconductor device according to the present embodiment. The steps of manufacturing the semiconductor device according to the present embodiment will be described with reference to FIGS. 2 and 3.

First, a coating material for a reflection preventive film is dropped onto a semiconductor wafer (semiconductor substrate), and the wafer is rotated to spread the material by a spin coating process. Thereafter, the wafer is heated, and the reflection preventive film having a thickness of about 50 nm is formed (step ST101). Next, an ArF chemical amplification type resist film including an acid generating material is formed into a film thickness of about 200 nm on the reflection preventive film (step ST102). This chemical amplification type resist is formed by the following procedure. First, a coating material for the chemical amplification type resist is spread on the reflection preventive film by the spin coating process. Moreover, a heating treatment is performed to remove a solvent contained in the coating material.

In surface analysis separately performed on the ArF chemical amplification type resist film used herein, it has been found that the acid generating material or an acid trap material (amine or the like) is distributed on the film surface. To remove the acid generating material or the acid trap material from the resist film surface, pure water is supplied onto the resist film to perform a cleaning treatment (step ST102a). Pure water, hydrogen water, carbonated water or the like is preferably used as a cleaning liquid, and the cleaning liquid may be selectively used depending on physical properties of substances adsorbed on the film surface. The hydrogen water exerts its effects on the adsorbed substance hydrogen-bonded to the film surface. When the adsorbed substance is electrically charged, the carbonated water exerts its effects. The acid generating material and the acid trap material are removed from the surface of the resist film by the cleaning.

FIGS. 4A and 4B are diagrams showing that the cleaning liquid is removed according to the present embodiment, FIG. 4A is a plane view, and FIG. 4B is a side view. The surface of the resist film subjected to the above-described cleaning treatment is dried by performing spin-drying, or by use of an air knife 21 provided with an air discharge port and having a length which is not less than a diameter of the semiconductor substrate 10 as shown in FIGS. 4A and 4B (step ST102b).

Specifically, a gas 22 from which acid and alkali are filtered is sprayed from the air knife 21 onto the surface of the semiconductor substrate 10. A region of the semiconductor substrate 10 onto which the air knife 21 sprays air is a part of the surface of the semiconductor substrate 10. To spray the air to the whole surface of the semiconductor substrate 10, the air knife 21 is scanned from one end to the other end of the semiconductor substrate 10 in a diametric direction on the surface of the substrate 10. In this case, the semiconductor substrate 10 may be rotated or remain stationary.

FIGS. 5A, 5B, and 5C are sectional views showing a part of the steps of manufacturing the semiconductor device according to the present embodiment.

As shown in FIG. 5A, a first cover film 52 is formed into a film thickness of about 20 nm on an ArF chemical amplification type resist film (having a contact angle of 75° to ultra pure water) 51 by a spin coating process (step ST103). The first cover film 52 is an organic film made of a polymeric material containing a fluorocarbon-based resin. It is to be noted that the first cover film 52 may be coated in such a manner as to prevent a film forming substance such as the resist film or the reflection preventive film on the semiconductor substrate 10 from being brought into contact with an immersion liquid during the subsequent exposure. When a water-soluble substance exists on the surface of the first cover film 52, cleaning and drying treatments are preferably performed in the same manner as in the steps ST102a and ST102b. However, the cleaning liquid for use in the cleaning treatment is preferably selected depending on the substance present on the first cover film 52.

The contact angle between the first cover film 52 and the ultra pure water which is the immersion liquid is about 110°. A second cover film 53 whose contact angle to the ultra pure water is smaller than 110° is formed on the surface of the first cover film 52 before immersion exposure (step ST104). As shown in FIG. 5B, a film having a contact angle of 88° to the ultra pure water which is the immersion liquid is used in the second cover film 53. The second cover film 53 is preferably insoluble in the immersion liquid.

Figure 6A:
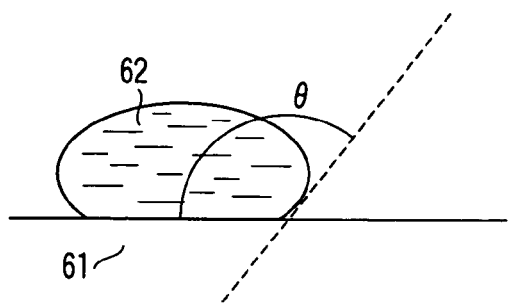
FIGS. 6A and 6B are explanatory views of a contact angle between a film and ultra pure water (liquid) in the embodiment.
Figure 6B:
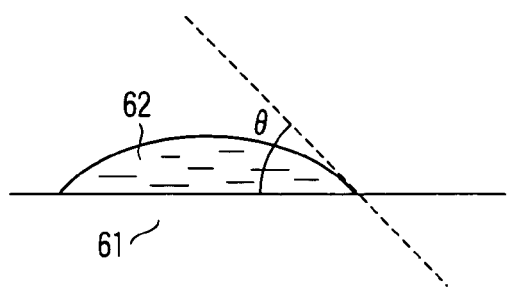

FIGS. 6A and 6B are explanatory views of the contact angle between the film and the ultra pure water (liquid). As shown in FIG. 6A, when the contact angle of a film 61 to ultra pure water 62 is in a range of 90° to 180°, the film 61 has hydrophobicity. As shown in FIG. 6B, when the contact angle of the film 61 to the ultra pure water 62 is in a range of 0° to 90°, the film 61 has hydrophilicity. It is to be noted that the hydrophobicity and the hydrophilicity are relative representations. In the present embodiment, the contact angle of the second cover film to the immersion liquid may be smaller than that of the first cover film. For example, the contact angle of the first cover film to the immersion liquid is 88° whereas the contact angle of the second cover film to the immersion liquid is 65°. Even when either of the films is hydrophilic, a function of the present embodiment can be achieved. The second cover film is formed independently of the first cover film in the present embodiment, but it has been confirmed that the contact angle can be reduced by exposing the surface of the first cover film constituted of the organic film to an oxidizing or oxygen radical such as an ozone gas, an OH radical, or an aqueous solution containing these radicals to oxidize the surface of the first cover film. Such surface altered layer may be regarded as the second cover film. For example, when the surface of the first cover film having a contact angle of 88° is exposed to the ozone gas, the surface altered layer (second cover film) having a contact angle of 72° can be formed.

Figure 7:
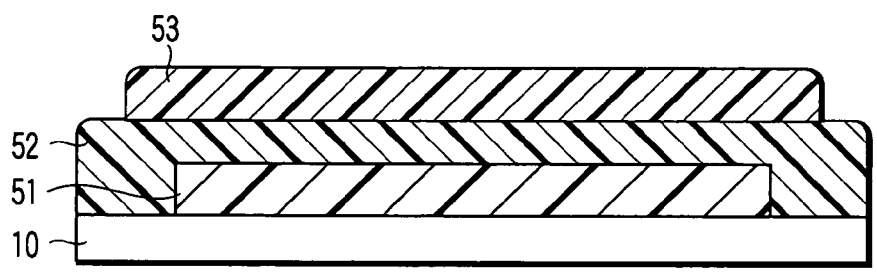
FIG. 7 is a sectional view showing a semiconductor substrate on which first and second cover films are formed in the embodiment.

FIG. 7 is a sectional view showing a semiconductor substrate on which the first cover film 52 and the second cover film 53 are formed. As shown in FIG. 7, an edge cut portion of the first cover film 52 is preferably positioned on an outer peripheral side of the semiconductor substrate 10 from an inner position which is 3 mm from an outer periphery of the semiconductor substrate 10 so that the edge cut portion covers an outer peripheral portion of the semiconductor substrate 10 as much as possible. A position of the edge cut portion of the second cover film 53 is preferably disposed inwards from that of the edge cut portion of the first cover film 52. Furthermore, when a wafer bevel portion of the semiconductor substrate 10 is formed to have a large contact angle to the immersion liquid, leakage of the immersion liquid to the wafer stage can be inhibited. When the outer peripheral portion of the semiconductor substrate 10 is formed to be hydrophobic by means of the first cover film 52, leakage of water to the wafer stage can be inhibited.

Next, the semiconductor substrate 10 is conveyed to the exposure tool shown in FIG. 1 (step ST105). A semiconductor device pattern formed on the reticle 32 by use of the exposure tool is transferred to the resist film 51 to form a latent image (step ST106). After this exposure, the semiconductor substrate 10 is conveyed out of the exposure tool (step ST107).

Figure 8:
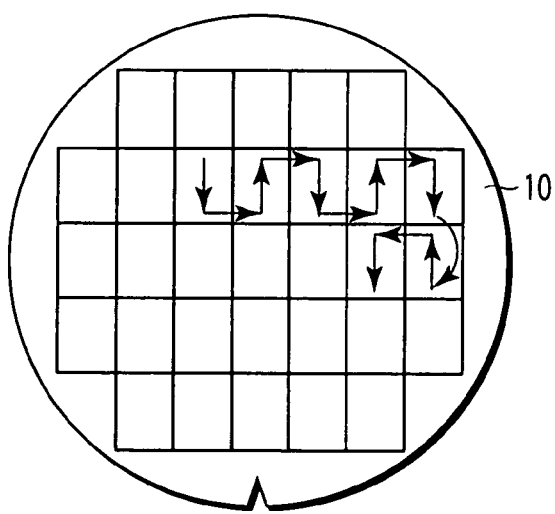
FIG. 8 is a plane view of a semiconductor substrate showing one example of an exposure order in a case where each exposure field is successively scanned and exposed in the embodiment.

FIG. 8 is a plane view of the semiconductor substrate 10 showing one example of an exposure order in a case where each exposure field is successively scanned and exposed. In FIG. 8, upward and downward arrows indicate directions in which exposure slit regions move, respectively. As shown in FIG. 8, when a certain exposure field is scanned and exposed, and the adjacent field is scanned and exposed, a scanning direction is reversed. While such operation is repeated, the whole surface of the semiconductor substrate 10 is exposed.

Figure 9:
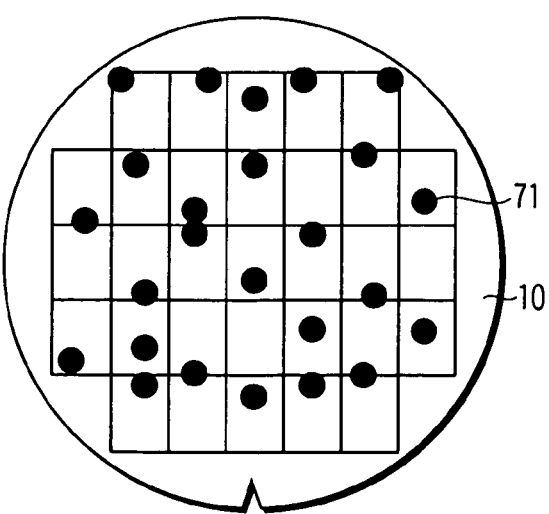
FIG. 9 is a plane view showing liquid droplets remaining on the substrate after the scanning exposure in the embodiment.

Additionally, during the scanning exposure, the water supply and discharge units 36, 36 recover the ultra pure water so that any ultra pure water is not left outside the region surrounded with the fence 35. However, when the cover film on the semiconductor substrate easily repels the ultra pure water (the contact angle of the cover film to the ultra pure water is large), a movement speed of the wafer stage 34 is fast, the wafer stage 34 is largely accelerated, or there is a comparatively large exposure region, as shown in FIG. 9, remaining water droplets 71 are generated on the cover film of the semiconductor substrate 10. When the water droplets 71 remain on the cover film, the ultra pure water is adsorbed on the surface of the cover film, or the water permeates the cover film, and the water is absorbed into the cover film.

In a case where the next heating (post exposure bake) is performed in a state in which the ultra pure water is adsorbed or absorbed by the cover film, a portion that has adsorbed or absorbed the ultra pure water absorbs heat and has a less amount of heat supplied to the resist film as compared with another portion. Therefore, reaction due to the heating in the resist film cannot be sufficiently caused, and an extraordinary linear width is generated. When the resist is a positive resist, defects of non-openings are generated. When the resist is a negative resist, open defects are disadvantageously generated.

To solve these problems, the residue water remaining on the cover film and the pure water absorbed by the cover film need to be removed from the semiconductor substrate conveyed out of the exposure tool. In the first embodiment, since the hydrophilic second cover film 53 is disposed on the surface of the hydrophobic first cover film 52, a water content does not easily aggregate on the second cover film 53, and any watermark is not easily generated.

It is to be noted that when a capability of trapping the ultra pure water in the first cover film 52 is insufficient and the ultra pure water permeates the resist film 51 during the immersion exposure, the ultra pure water that has permeated the resist film 51 is removed together with the ultra pure water on the cover film 53 and in the cover films 52, 53 by a spin drying process, a process in which a semiconductor substrate is heated on a hot plate or the like. However, when the ultra pure water trapping capability of the first cover film 52 is sufficient, and any ultra pure water does not permeate the resist film 51, any ultra pure water is not removed from the resist film 51.

Next, the second cover film 53 is removed from the surface of the resist film 51 (step ST108), and the first cover film 52 is removed (step ST109). The semiconductor substrate 10 subjected to such treatment is conveyed to a baker, and the semiconductor substrate 10 is heated (PEB) (step ST110). According to the heating, acid generated in an exposure stage is diffused, and amplified and reacted. Furthermore, the semiconductor substrate 10 is conveyed to a developing unit to develop the image, and an ArF resist pattern is formed (step ST111).

Alternatively, after the exposure, the PEB may be performed (step ST110), the second cover film 53 may be removed (step ST108), and the first cover film 52 may be removed (step ST109). Alternatively, after the exposure, the second cover film 53 may be removed (step ST108), the PEB may be performed (step ST110), and the first cover film 52 may be removed (step ST109). After these treatments, a developing treatment is performed (step ST111). It is possible to manufacture a semiconductor device by use of the semiconductor substrate having the resist pattern formed as described above.

It is to be noted that when any reflection preventive film is not required, the step ST101 may be omitted.

It is to be noted that the cover films 52 and 53 may be removed during the developing in a case where the cover films 52 and 53 are insoluble in a developing solution. When any acid generating material or acid trap material (amine or the like) is not present on the surface of the ArF chemical amplification type resist film, the steps ST103 and ST104 may be omitted.

Moreover, in the above-described manufacturing steps, the first cover film 52 having a contact angle of about 110° to the ultra pure water is formed. However, when the second cover film is formed independently of the first cover film, the first cover film 52 having a contact angle of about 75° to the ultra pure water may be formed. Moreover, while retaining the substrate at about 80° C., the surface of the first cover film 52 may be exposed to an atmosphere of an organic silazane compound, typically hexamethyl disilazane or trimethyl disilazane to modify the surface of the first cover film 52 and perform a hydrophobic treatment. In this case, the surface is preferably modified to form a layer (large contact angle layer) having a contact angle of 80° or more between the first cover film 52 and the ultra pure water. It is to be noted that the surface of the first cover film 52 may be modified by exposing the surface of the first cover film 52 having a contact angle of about 75° to the ultra pure water to a liquid or atmosphere of the organic silazane compound or a fluorine compound.

Additionally, the atmosphere needs to be controlled in the steps from at least the exposure tool to the baker via a water treatment unit after the exposure. It has been found that a concentration of a basic substance needs to be set to 10 ppb or less in order to inhibit acid from being deactivated to such an extent that the forming of the resist pattern is not influenced. Moreover, an experiment result has been obtained which indicates that a treatment time including a conveying time is preferably managed in a range of ±10%.

FIGS. 10A and 10B are diagrams showing the cover film on the resist film (contact angle to water is 75°) according to a conventional example. As shown in FIG. 10A, in a case where the only first cover film (film having a low affinity with respect to the immersion liquid: contact angle to water is 90° or more) 52 is used, when a liquid droplet 54 on the cover film is reduced to increase an inner pressure, the liquid permeates a portion of the cover film having a comparatively high affinity to the immersion liquid. As shown in FIG. 10B, the liquid spreads in an interface between the first cover film 52 and the resist film 51 surface. Since the pressure of the spread liquid film is reduced, the liquid penetrates through the cover film 52 and cannot be discharged to the outside. The liquid stays in the corresponding portion, or permeates the lower resist film 51, thereby finally forming a watermark 55.

FIGS. 11A and 11B are diagrams showing the cover film on the resist film (contact angle to water is 75°) according to another conventional example. As shown in FIG. 11A, when the only second cover film (film having a high affinity to the immersion liquid: contact angle to water is less than 90°) 53 is used, the liquid droplet 54 on the cover film easily penetrates. As shown in FIG. 11B, the liquid reaches the interface between the second cover film 53 and the resist film 51 surface. The water which has reached the interface spreads in the interface or penetrates to the lower resist film 51. Even in this case, the watermark 55 is finally formed.

FIGS. 12A and 12B are diagrams showing the cover film on the resist film (contact angle to water is 75°) according to the present embodiment. In the present embodiment, as shown in FIG. 12A, the second cover film 53 having a higher affinity to the immersion liquid (contact angle to water is less than 90°) as compared with the first cover film 52 is formed on the surface of the first cover film 52 having a low affinity to the immersion liquid (contact angle to water is 90° or more) for the following reason.

As shown in FIG. 12A, the liquid droplet 54 formed on the second cover film 53 penetrates to the second cover film 53 having a high affinity, but is diffused owing to a high penetrance. When the liquid droplet 54 reaches the first cover film 52 having a low affinity, the liquid has a spread, and therefore a pressure is reduced. Therefore, the permeating liquid droplet 54 does not have a force to penetrate through the first cover film 52. As shown in FIG. 12B, the liquid droplet is retained between the first cover film 52 and the second cover film 53, and does not reach the resist film 51. Therefore, a performance of the resist is not lost, and any watermark is not formed on the resist film 51. It is to be noted that the affinity of the first cover film 52 to the immersion liquid may be lowered as much as possible.

To maximize the function, the third cover film having a low affinity may be formed on the second cover film 53 having a high affinity to the immersion liquid, the affinity of the third cover film to the immersion liquid may be lowered as much as possible, and the affinity of the second cover film 53 to the immersion liquid may be enhanced as much as possible.

It is to be noted that the second cover film 53 may be subjected to a hydrophilic treatment. This treatment is performed by supplying ozone water having an ozone concentration of about 20 ppm to the second cover film 53 for about 30 seconds. The surface of the second cover film 53 is removed by the ozone water, and the contact angle between the surface and the ultra pure water becomes 5° or less. In the first embodiment, as shown in FIG. 5C, the second cover film 53 which is a hydrophilic layer (small contact angle layer) has a contact angle of 5° to the ultra pure water, and this angle is smaller than that (75°) of the resist film 51 with the ultra pure water. It is to be noted that to form the second cover film 53 to be hydrophilic, the surface of the film may be exposed to an ozone-containing gas instead of an ozone-containing liquid.

According to the present embodiment, when the cover film having a hydrophobicity higher than that of the resist is formed on the resist film, and the cover film is subjected to the immersion exposure, the permeation of the ultra pure water into the resist film can be inhibited during the immersion exposure. The immersion liquid can be inhibited from being contaminated from a resist composition. Furthermore, when the surface of the cover film is formed to be hydrophilic, and the ultra pure water is removed after the immersion exposure, the water remaining on the surface of the cover film can be removed without generating any watermark. As a result, a pattern forming defect can be inhibited from being generated.

It is to be noted that in the present embodiment, deaerated ultra pure water is used in the immersion liquid interposed between the lens and the substrate to be treated (semiconductor substrate) during the exposure, but there is not any restriction on the water. A liquid to which an alkali ion of the group 1 or 2 is added may be used in order to increase a refractive index, or a liquid to which an acid ion is added may be used in order to reduce an absorption coefficient. In a case where an exposure tool is used which has a small absorption coefficient with respect to exposure light and which is adjusted into a specific refractive index, any liquid may be used as long as the liquid has the specific refractive index, and does not damage a lens system.

Moreover, the present embodiment relates to exposure using ArF (193 nm) light, but the patterning can be performed with a satisfactory precision, when even exposure using KrF (248 nm) light is performed in the same manner as in the present embodiment. It has also been confirmed that in $F_2$ (157 nm) exposure, the patterning can be performed with a satisfactory precision by use of a fluorine-based oil in a first solvent.

Furthermore, in the present embodiment, as the immersion liquid, the first cover film 52, and the second cover film 53, liquids and films are usable which are disclosed in "Characterization of Refractive Properties of Fluids for Immersion Photolithography", Simon G. Kaplan, John H. Burnett, Xiaoping Gao, and Peng Zhang, International Symposium on Immersion and 157 nm Lithography Aug. 3, 2004.

As the organic immersion liquid, there is usable an alcohol-based solvent such as isopropano or glycerol, or a petroleum-based solvent such as n-hexane, n-heptane, or n-decane.

When the alcohol-based solvent is used, a hydrophobic polymer or a fluorine-based resin is used as the first cover film 52, and polycyclopentene is used as the second cover film 53. An ozone-water treatment is performed as the hydrophilic treatment.

When the petroleum-based solvent is used, a lyophobic polymer is used as the first cover film, and an alcohol-based solvent such as isopropanol or isobutanol is used in the solvent. Typical examples of the resin of the first cover film include partially hydrolyzed polyvinyl acetate, polyvinyl alcohol, and polyethylene glycol. A lipophilic polymer is used as the second cover film, and a ketone-based solvent such as cyclohexanone or methyl isobutyl ketone is used in the solvent. Typical examples of the resin of the second cover film include an acrylic adamantil-styrene copolymer and hydrogenated polyisobutene.

According to the present embodiment, there can be provided a resist pattern forming method and a manufacturing method of a semiconductor device in which the generation of the watermark on the cover film formed on the resist film and the permeation of the immersion liquid into the resist film are prevented.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A resist pattern forming method of forming a resist pattern by immersion exposure, comprising:
    forming a resist film on a substrate to be treated, a contact angle between the resist film and an immersion liquid being a first angle;
    forming a first cover film on the resist film, a contact angle between the first cover film and the immersion liquid being a second angle which is larger than the first angle;
    forming a second cover film on the first cover film, a contact angle between the second cover film and the immersion liquid being a third angle which is smaller than the first angle; and
    forming a latent image on the resist film by the immersion exposure.

2. The resist pattern forming method according to claim 1, wherein the first cover film is an organic film made of a polymeric material containing a fluorocarbon-based resin.

3. The resist pattern forming method according to claim 1, wherein the second cover film is formed by modifying the surface of the first cover film.

4. The resist pattern forming method according to claim 1, wherein the surface of the first cover film is exposed to a liquid or atmosphere of an organic silazane compound or a fluorine compound to form a layer having a contact angle which is the second angle.

5. The resist pattern forming method according to claim 4, wherein the organic silazane compound is hexamethyl disilazane or trimethyl disilazane.

6. The resist pattern forming method according to claim 1, wherein the second cover film is insoluble in the immersion liquid.

7. The resist pattern forming method according to claim 1, wherein an edge cut portion of the first cover film covers an outer peripheral portion of the substrate to be treated.

8. The resist pattern forming method according to claim 1, wherein an edge cut portion of the second cover film is disposed inwards from an edge cut portion of the first cover film.

9. The resist pattern forming method according to claim 1, wherein a wafer bevel portion of the substrate to be treated is formed to have a large contact angle to the immersion liquid.

10. The resist pattern forming method according to claim 1, wherein ultra pure water in the resist film, the first cover film, and the second cover film is removed after the immersion exposure.

11. The resist pattern forming method according to claim 1, wherein the substrate to be treated is heated after the immersion exposure.

12. The resist pattern forming method according to claim 1, wherein the second cover film is a film formed by performing a treatment to reduce the contact angle between the surface of the first cover film and the immersion liquid.

13. The resist pattern forming method according to claim 12, wherein the treatment to reduce the contact angle is performed by exposing the first cover film to an ozone-containing liquid or gas.

14. The resist pattern forming method according to claim 1, wherein the second angle is 90° or more and the third angle is less than 90°.

15. The resist pattern forming method according to claim 1, wherein the immersion liquid includes an alkali ion.

16. The resist pattern forming method according to claim 1, wherein the immersion liquid includes an acid ion.

17. A manufacturing method of a semiconductor device by use of a semiconductor substrate having a resist pattern formed by:
    forming a resist film on a substrate to be treated, a contact angle between the resist film and an immersion liquid being a first angle;
    forming a first cover film on the resist film, a contact angle between the first cover film and the immersion liquid being a second angle which is larger than the first angle;
    forming a second cover film on the first cover film, a contact angle between the second cover film and the immersion liquid being a third angle which is smaller than the first angle; and
    forming a latent image on the resist film by immersion exposure.

* * * * *